United States Patent [19]

Suzuki

[11] Patent Number: 4,710,792

[45] Date of Patent: Dec. 1, 1987

[54] GATE TURN-OFF THYRISTOR

[75] Inventor: Masanori Suzuki, Itami, Japan

[73] Assignee: Mitsubishi Denki Kabushiki Kaisha, Tokyo, Japan

[21] Appl. No.: 705,118

[22] Filed: Feb. 22, 1985

[30] Foreign Application Priority Data

Apr. 17, 1984 [JP] Japan .................................. 59-78924

[51] Int. Cl.⁴ ..................... H01L 29/74; H01L 29/167
[52] U.S. Cl. ........................................ 357/38; 357/64; 357/91
[58] Field of Search ...................... 357/38 S, 38 G, 64, 357/91

[56] References Cited

U.S. PATENT DOCUMENTS

| | | | |
|---|---|---|---|
| 3,943,549 | 3/1976 | Jaecklin et al. | 357/38 |
| 3,988,771 | 10/1976 | Krishna | 357/64 |
| 4,165,517 | 8/1979 | Temple et al. | 357/38 |
| 4,187,517 | 2/1980 | Platzöder | 357/38 |

FOREIGN PATENT DOCUMENTS

| | | | |
|---|---|---|---|
| 0022355 | 7/1980 | European Pat. Off. | |
| 48284 | 4/1976 | Japan . | |
| 58-103171 | 6/1983 | Japan | 357/386 |
| 1425956 | 4/1973 | United Kingdom . | |
| 1478472 | 7/1974 | United Kingdom . | |

OTHER PUBLICATIONS

*Gate Turn-Off in p-n-p-n Devices*, E. D. Wolley, IEEE Transactions on Electron Devices, vol. 13, No. 7, Jul. 1966, pp. 590–597.

*Primary Examiner*—Martin H. Edlow
*Assistant Examiner*—Robert P. Limanek
*Attorney, Agent, or Firm*—Lowe, Price, LeBlanc, Becker & Shur

[57] ABSTRACT

A gate turn-off thyristor comprises a semiconductor wafer (8) structured by an N-base layer (8c), a P-base layer (8b) adjacent to one side of the N-base layer (8c), an N-emitter layer 8d adjacent to the other side of the N-base layer (8c), and a plurality of N-emitter regions (8a) formed on the outer surface of the P-base layer (8b) excluding a region serving as a gate region and further comprises a first electrode (9) on the outer surface of the P-emitter layer (8d), second electrodes (5) on the outer surfaces of the N-emitter regions (8a), a gate electrode (4) on the outer surface of the gate region and a lead-out point (7) for the gate electrode, and the above described gate turn-off thyristor is characterized in that the semiconductor wafer (8) includes a plurality of areas (3A and 3B) having different carrier life times and that the life time is the longest in the first area (3A) where the gate lead-out point (7) is positioned, while the life time is shorter in the area (3B) farther from the gate lead-out point (7).

4 Claims, 7 Drawing Figures

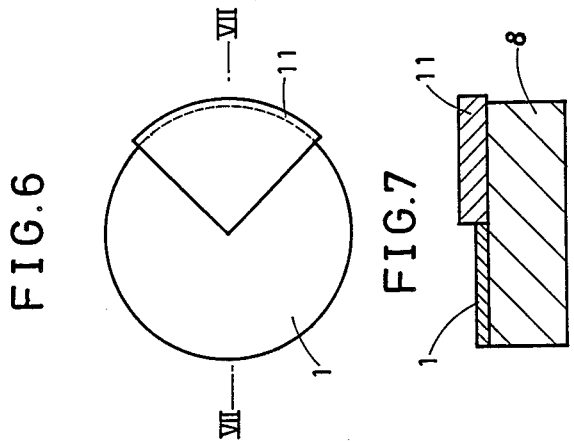
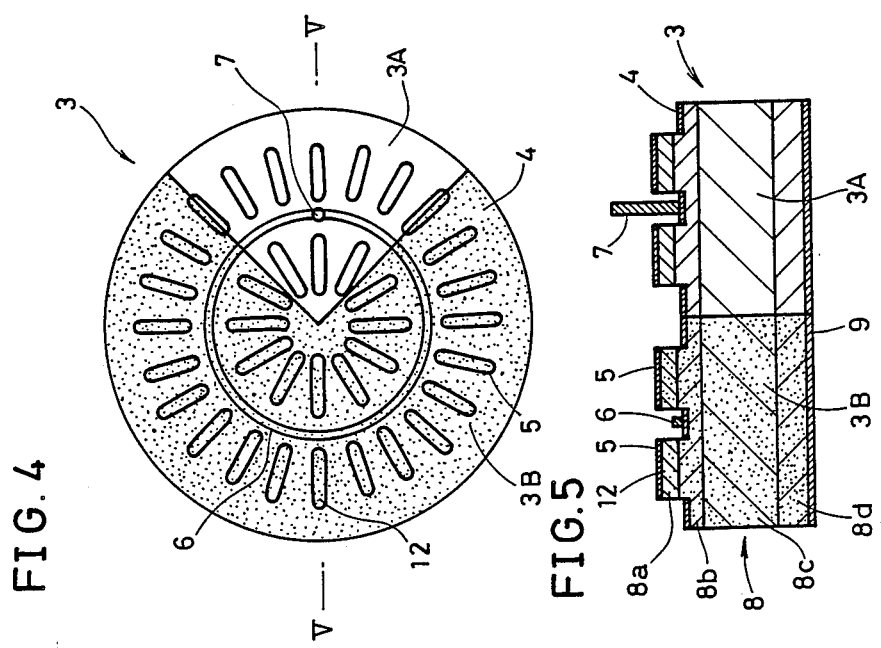

GATE TURN-OFF THYRISTOR

BACKGROUND OF THE INVENTION

1. Field of the Invention

The present invention relates to a gate turn-off thyristor (GTO) and particularly to an improvement of the ON-OFF characteristics thereof by the control of the carrier life time.

2. Description of the Prior Art

An example of a GTO in which the turn-off characteristics are improved by diffused Au in low concentration to control the carrier life time is disclosed in Japanese Patent Laying-Open Gazette No. 48284/1976.

FIG. 1 shows an example of a GTO in which the carrier life time is controlled as described above, and FIG. 2 shows a sectional view taken along the line II—II in FIG. 1. In the GTO, a number of emitter regions 8a provided with cathode electrodes 5 are generally formed on one major surface of a silicon wafer 8 so as to make it easy to draw excess carriers through the gate at the time of turning off. The respective emitter regions are surrounded by a gate region 4 covering the whole major surface excluding the emitter regions. On the gate electrode 4, a gate lead 6 lead out from a point 7 is provided. The gate electrode 4 and the gate lead 6 are generally of aluminum. On the other major surface of the silicon wafer 8, generally Mo is provided to form an anode electrode 9. The wafer 8 includes the N-emitter regions 8a, a P-base layer 8b, an N-base layer 8c and a P-emitter layer 8d.

In general, in order to improve the turn-off characteristics of a GTO, it is important to shorten the carrier lifetime by making the carrier disappear by recombination in the semiconductor, as well as to increase the capacity for drawing excess carriers through the gate. Accordingly, a method of shortening the carrier life time by diffusing carrier killers into a semiconductor wafer from a carrier killer source is generally applied in the manufacturing of GTO.

FIG. 3 is a schematic view for explaining a conventional method for controlling the carrier life time. In FIG. 3, a carrier killer source 1 of Au, Pt or the like is provided on a silicon wafer 8. A thin film 1 as the killer source is grown over the whole upper surface of the silicon wafer 8 by evaporation or sputtering after a preliminary treatment for the silicon wafer 8 with hydrofluoric acid, ammonium fluoride or the like. Then, in order that Au, Pt or the like of the killer source 1 may be diffused into the silicon wafer 8 to serve as the carrier killers, the silicon wafer is placed in a diffusion furnace at a prescribed temperature for a prescribed period of time. By the carrier killers thus diffused, the carrier life time is controlled.

In this case, if the concentration of the carrier killer is too high to cause the carrier life time to be too short, the turn-off characteristics are improved but the turn-on characteristics are deteriorated on the contrary and particularly the ON voltage of the GTO becomes high. Accordingly, the concentration of the carrier killer is selected to be a suitable value by taking account of both the ON characteristics and the OFF characteristics of the GTO. As can be seen in FIG. 3, the control is made by uniformly shortening the carrier life time in the whole area of the silicon wafer.

However, gate current due to the draw of the excess carriers (shown by the arrows in FIGS. 1 and 2) at the time of turning off is generated not uniform in the whole gate region and is collected finally at the gate lead-out point 7, from which the gate current flows to the outside of the package. Recently, according to a tendency toward large capacity of GTO, the gate current has become an extremely large value. Although the gate current is caused to flow by applying negative voltage to the gate in relation to the cathode electrode, this potential difference is determined by the avalanche voltage between the gate and the cathode and consequently cannot be made so large. Accordingly, voltage drop due to the resistance of the aluminum layer and the gate lead of the gate electrode where gate current due to the draw of excess carrier flow cannot be neglected with respect to the voltage applied between the gate and the cathode and the draw of carriers is not sufficiently made in areas distant from the gate lead-out point 7. As a result, breakdown at the time of turning off of the GTO occurs generally in areas distant from the gate lead-out point 7, which poses a serious problem to be solved for improving the characteristics of the GTO.

SUMMARY OF THE INVENTION

A primary object of the present invention is to provide a gate turn-off thyristor (GTO) in which the above described disadvantages are overcome.

A GTO in accordance with the present invention comprises, in the same manner as in a conventional GTO, a semiconductor wafer including a plurality of emitter regions of a first conductivity type, a base layer of a second conductivity type, a base layer of the first conductivity type and an emitter layer of the second conductivity type. The respective emitter regions of the first conductivity type on one major surface of the semiconductor wafer are surrounded by a gate region covering the whole major surface excluding these emitter regions. The surfaces of the emitter regions of the first conductivity type and the surface of the gate region are respectively covered with electrode layers and the surface of the emitter layer of the second conductivity type is also covered with an electrode layer. This semiconductor wafer includes a plurality of areas having different carrier life times, and the life time is the longest in the first area containing a gate lead-out point and the more an area is distant from the gate lead-out point, the shorter is the life time in the area.

Thus, even in an area distant from the gate lead-out point, excess carriers can be caused to disappear rapidly at the time of turning off the GTO.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a plan view of a GTO of an embodiment of the present invention;

FIG. 5 is a sectional view taken along the line V—V in FIG. 4;

FIG. 6 is a plan view showing a semiconductor wafer in a step of a manufacturing method of a GTO in accordance with the present invention; and FIG. 7 is a sectional view taken along the line VII—VII in FIG. 6.

DESCRIPTION OF THE PREFERRED EMBODIMENTS

Figure 3:
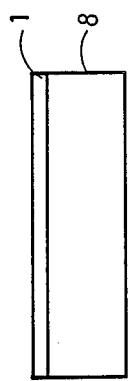
FIG. 3 is a side view of a semiconductor wafer in which a carrier killer source is provided over the whole area of one major surface thereof.
Figure 1:
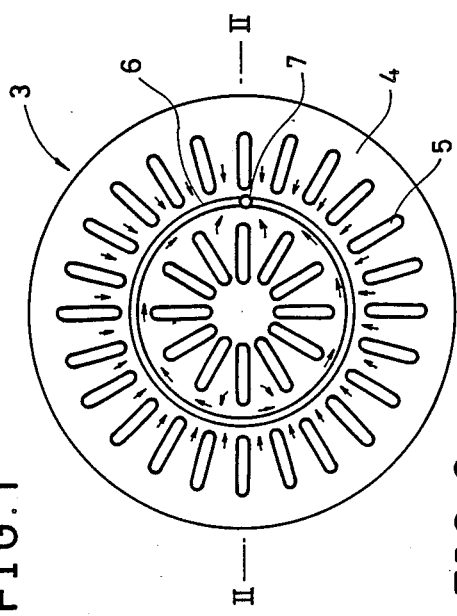
FIG. 1 is a plan view of a conventional GTO in which carrier killers are diffused uniformly over the whole area.
Figure 2:
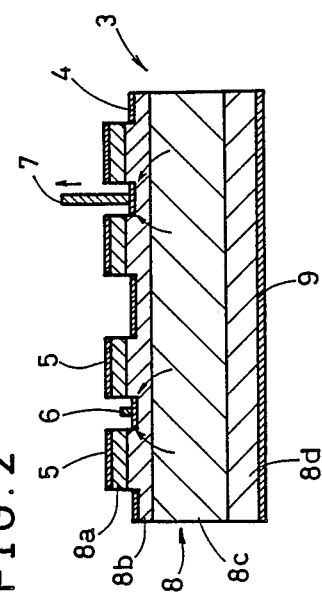
FIG. 2 is a sectional view taken along the line II—II in FIG. 1.

FIG. 4 is a plan view of a GTO in accordance with the present invention and FIG. 5 is a sectional view taken along the line V—V in FIG. 4. In FIGS. 4 and 5, the reference characters identical to those in FIGS. 1 and 2 indicate identical or corresponding portions. An emitter 12 is the most distant from a lead-out point 7 of a gate lead 6. In this embodiment, an area 3A where the carrier life time of the silicon wafer is longer is made to contain the gate lead-out point 7 and an area 3B where the carrier life time is shorter is made to contain the emitter 12. The area 3B with the shorter life time needs a less amount of draw of carriers through the gate because of the recombination of carriers with the carrier killer. On the other hand, the area 3A with the longer life time needs a large amount of draw of carriers through the gate. However, since the gate lead-out point 7 is positioned closely, a voltage drop due to the resistance of the aluminum layer 4 and the aluminum line 6 of the gate electrode is not significant in this area 3A and accordingly the carrier draw function can be performed sufficiently.

The area 3A is positioned so that the shortest distance from the gate lead-out point 7 to a border of the area 3A may be larger than the carrier diffusion distance in the area 3A. This is because the carriers can be drawn out without passing through the aluminum layer 4 of the gate electrode since the carriers can move in the wafer by the diffusion distance. In other words, the voltage drop in the aluminum layer 4 or the gate lead 6 of the gate electrode regarded as an important factor causing failure in turning off of the GTO can be neglected. Since the voltage drop due to the resistance of the aluminum layer 4 and the gate lead 6 of the gate electrode becomes the largest in the emitter 12 which is the most distant from the gate lead-out point 7, the carrier life time in the area containing this emitter 12 is set to the smallest value.

Generally, the ON current of a GTO increases in connection with a given current density if the carrier life time is made shorter. Assuming that the ON voltage of a GTO of this embodiment is V, that the ON voltage in case of the carrier life time in the whole area of the wafer being equal to the longer life time $\tau_A$ in the area 3A is $V_A$ and that the ON voltage in case of the carrier life time in the whole area being equal to the shorter life time $\tau_B$ in the area 3B is $V_B$, it can be easily understood that the ON voltage V has a value larger than $V_A$ and smaller than $V_B$. This ON voltage V is considered to be determined by a ratio of the dimensions of the areas 3A and 3B.

Accordingly, if a GTO in accordance with the present invention is made to have the same turn-off capacity as that of a conventional GTO, the ON voltage in the present invention can be made smaller since the carrier life time in the area 3A containing the gate lead-out point 7 is longer as compared with the conventional GTO.

If the same ON voltage as in a conventional GTO is set in a GTO of the present invention, turn-off capacity can be improved in the present invention since the carrier life time in the area 3B containing the emitter 12 the most distant from the gate lead outgoing point 7 is shorter as compared with the conventional GTO.

Now, a manufacturing method of a GTO shown in FIGS. 4 and 5 will be described in the following. FIG. 6 is a top view of a silicon wafer in a step of this manufacturing method and FIG. 7 shows a sectional view taken along the line VII—VII in FIG. 6.

First, a silicon wafer 8 having a structure of four layers (8a, 8b, 8c and 8d) is prepared for a GTO. On one major surface of the wafer 8, a mask 11 is formed except for an area assigned for a carrier killer source of Au, Pt or the like as shown in FIG. 6. Subsequently, a film 1 as the carrier killer source is formed on the wafer 8 by evaporation or sputtering of Au or Pt or the like. Then, the wafer 8 as shown in FIG. 6 is kept placed in a diffusion furnace at a prescribed temperature for a prescribed period of time. In this period, the carrier killers are diffused into the area of the wafer positioned under the killer source 1 but is not diffused into the area covered with the mask 11. After this diffusion treatment, the mask 11 and the carrier killer source 1 are removed so that the wafer 8 comprising two areas of different carrier life times, namely, an area where the carrier killers are diffused and an area where the carrier killers are not diffused, is obtained. Additionally, a new mask may be subsequently formed in the region where the killer source 1 was provided and a killer source may be formed in the region where the mask 11 was provided, so that the carrier killers may be diffused with the conditions of heat treatment different from those of the previous treatment.

Alternatively, the carrier killers may be diffused uniformly over the whole area of the wafer and then the carrier killers may be further diffused only in a given region. Or alternatively, a carrier killer source may be formed over the whole area of the wafer by evaporation or sputtering and then the carrier killer source in a specified area may be removed by etching so that heat treatment may be applied.

Although in FIGS. 6 and 7, the carrier killer source was formed only on one major surface of the wafer, it goes without saying that carrier killer sources may also be formed on both the major surfaces of the wafer. On the wafer where the carrier killers are thus diffused, a gate electrode 4 and cathode electrodes 5 are formed by evaporation or sputtering of Al or the like so as to be in ohmic contact with the wafer and on the surface of the P-emitter 8d, Mo is applied to form an anode electrode 9.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In a gate turn-off thyristor comprising a semiconductor wafer structured by a first base layer (8c) of a first conductivity type semiconductor, a second base layer (8b) of second conductivity type semiconductor adjacent to one side of said first base layer (8c), a first emitter layer (8d) of said second conductivity type semiconductor adjacent to the other side of said first base layer (8c), and a plurality of second emitter regions (8a) of said first conductivity type semiconductor formed on the outer surface of said second base layer (8b) excluding a region assigned for a gate region, further comprising a first electrode (9) on the outer surface of said first emitted layer (8d), second electrodes (5) on the outer surfaces of said second emitter regions (8a), a gate electrode (4) on the outer surface of said gate region and a lead-out point (7) for said gate electrode (4), the improvement wherein said semiconductor wafer (8) includes a plurality of areas (3A and 3b) having different carrier lifetimes, said lifetime being the longest in a first area (3A) of said areas where said gate lead-out point (7) is positioned and said lifetime being shorter in a second area (3B) of said areas further from said gate led-out point (7) wherein said lifetime is controlled by carrier killer of Au or Pt diffused in said wafer and the concentration of said carrier killer is the lowest in said first area and becomes higher in the second area farther from said gate lead-out point (7) wherein said carrier lifetime in said second area is shortest in the second emitter region further from the first area.

2. A gate turn-off thyristor in accordance with claim 1, wherein the shortest distance from said gate lead-out point (7) to a border between said first and second area is longer than the diffusion distance of the carrier having said lifetime in said first area.

3. In a gate turn-off thyristor comprising a semiconductor wafer structured by a first base layer (8c) of a first conductivity type semiconductor, a second base layer (8b) of a second conductivity type semiconductor adjacent to one side of said first base layer (8c), a first emitter layer (8d) of said second conductivity type semiconductor adjacent to the other side of said first base layer (8c), and a plurality of second emitter regions (8a) of said first conductivity type semiconductor formed on the outer surface of said second base layer (8b) excluding a region assigned for a gate region, further comprising a first electrode (9) on the outer surface of said first emitter layer (8d), second electrodes (5) on the outer surfaces of said second emitter regions (8a), a gate electrode (4) on the outer surface of said gate region and a lead-out point (7) for said gate electrode (4), the improvement wherein said semiconductor wafer (8) includes a plurality of areas (3A and 3b) having different carrier lifetimes, said lifetime being the longest in a first area (3A) of said areas where said gate lead-out point (7) is positioned and said lifetime being shorter in a second area (3B) of said areas further said gate lead-out point (7), wherein said carrier lifetime in said second area is smallest in the second emitter region furthest from the first area.

4. The thyristor of claim 3, wherein the shortest distance from said gate lead-out point to a border between said first and second areas is longer than the diffusion distance of the carrier having said lifetime in said first area.

* * * * *